(12) United States Patent
Choi et al.

(10) Patent No.: US 7,248,510 B2
(45) Date of Patent: Jul. 24, 2007

(54) CIRCUITS THAT GENERATE AN INTERNAL SUPPLY VOLTAGE AND SEMICONDUCTOR MEMORY DEVICES THAT INCLUDE THOSE CIRCUITS

(75) Inventors: Sung-Ho Choi, Gyeonggi-do (KR); Jun-Ho Shin, Gyeonggi-do (KR); Seung-Hoon Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 61 days.

(21) Appl. No.: 11/172,256

(22) Filed: Jun. 30, 2005

(65) Prior Publication Data

US 2006/0181937 A1    Aug. 17, 2006

(30) Foreign Application Priority Data

Feb. 15, 2005    (KR)    ............ 10-2005-0012186

(51) Int. Cl.
*G11C 5/14*    (2006.01)
*G05F 1/10*    (2006.01)

(52) U.S. Cl. ............... 365/189.09; 365/226; 327/538; 327/541

(58) Field of Classification Search ............ 365/189.09
See application file for complete search history.

(56) References Cited

U.S. PATENT DOCUMENTS

| | | | | |
|---|---|---|---|---|
| 5,373,477 | A * | 12/1994 | Sugibayashi | 365/226 |
| 5,673,232 | A * | 9/1997 | Furutani | 365/226 |
| 5,757,714 | A * | 5/1998 | Choi et al. | 365/226 |
| 5,978,299 | A * | 11/1999 | Yamasaki et al. | 365/226 |
| 6,087,891 | A * | 7/2000 | Yoon et al. | 327/530 |
| 6,097,180 | A * | 8/2000 | Tsukude et al. | 323/313 |
| 6,107,700 | A * | 8/2000 | Ishikawa et al. | 307/116 |
| 6,163,180 | A * | 12/2000 | Hidaka et al. | 327/112 |
| 6,512,715 | B2 * | 1/2003 | Okamoto et al. | 365/227 |
| 6,804,154 | B2 * | 10/2004 | Kitagawa et al. | 365/189.09 |
| 6,922,098 | B2 * | 7/2005 | Choi et al. | 327/538 |

(Continued)

FOREIGN PATENT DOCUMENTS

JP    6085179    3/1994

(Continued)

*Primary Examiner*—Son L. Mai
(74) *Attorney, Agent, or Firm*—Myers Bigel Sibley & Sajovec, PA (57) ABSTRACT

An internal supply voltage generation circuit is provided that is within a semiconductor memory device, and that is configured to generate an internal supply voltage to a memory array in the semiconductor memory device. The internal supply voltage generation circuit includes an internal driving unit, an internal transmission unit, and an internal sensing unit. The internal driving unit is configured to generate a driving current and a preliminary voltage responsive to an external supply voltage that is supplied from external to the semiconductor memory device, and it varies a magnitude of the driving current responsive to a driving control signal. The internal transmission unit is configured to generate the internal supply voltage responsive to the preliminary voltage from the internal driving unit, and to vary a level of the internal supply voltage to be at least a defined voltage difference less than a boosted voltage. The boosted voltage is greater than the external supply voltage. The internal sensing unit is configured to generate the driving control signal responsive to the internal supply voltage so that the internal supply voltage is maintained at a constant level.

21 Claims, 11 Drawing Sheets

U.S. PATENT DOCUMENTS

| | | | |
|---|---|---|---|
| 6,954,103 B2* | 10/2005 | Yamauchi et al. | 327/540 |
| 2003/0184362 A1* | 10/2003 | Kwon | 327/540 |
| 2003/0218452 A1* | 11/2003 | Brox | 323/282 |
| 2004/0017690 A1* | 1/2004 | Lee et al. | 365/145 |

FOREIGN PATENT DOCUMENTS

| | | |
|---|---|---|
| KR | 1019950007839 | 7/1995 |
| KR | 100170514 | 10/1998 |

* cited by examiner

CIRCUITS THAT GENERATE AN INTERNAL SUPPLY VOLTAGE AND SEMICONDUCTOR MEMORY DEVICES THAT INCLUDE THOSE CIRCUITS

CROSS REFERENCE TO RELATED APPLICATION

This application claims priority under 35 USC § 119 to Korean Patent Application No. 10-2005-0012186, filed on Feb. 15, 2005, the contents of which are incorporated by reference in its entirety.

FIELD OF THE INVENTION

The present invention relates to semiconductor memory devices and, more particularly, to circuits that generate an internal supply voltage and semiconductor memory devices that include supply voltage generation circuits.

BACKGROUND OF THE INVENTION

A semiconductor memory device generally includes different types of devices which operate with different internal voltage levels. The internal voltage levels are generally different from a voltage that is externally supplied to the semiconductor memory device. The semiconductor memory device can include circuits that provide various different internal voltage levels from the externally supplied voltage level. Two such exemplary circuits are a boosting voltage generation circuit and an internal supply voltage generation circuit.

Figure 1:
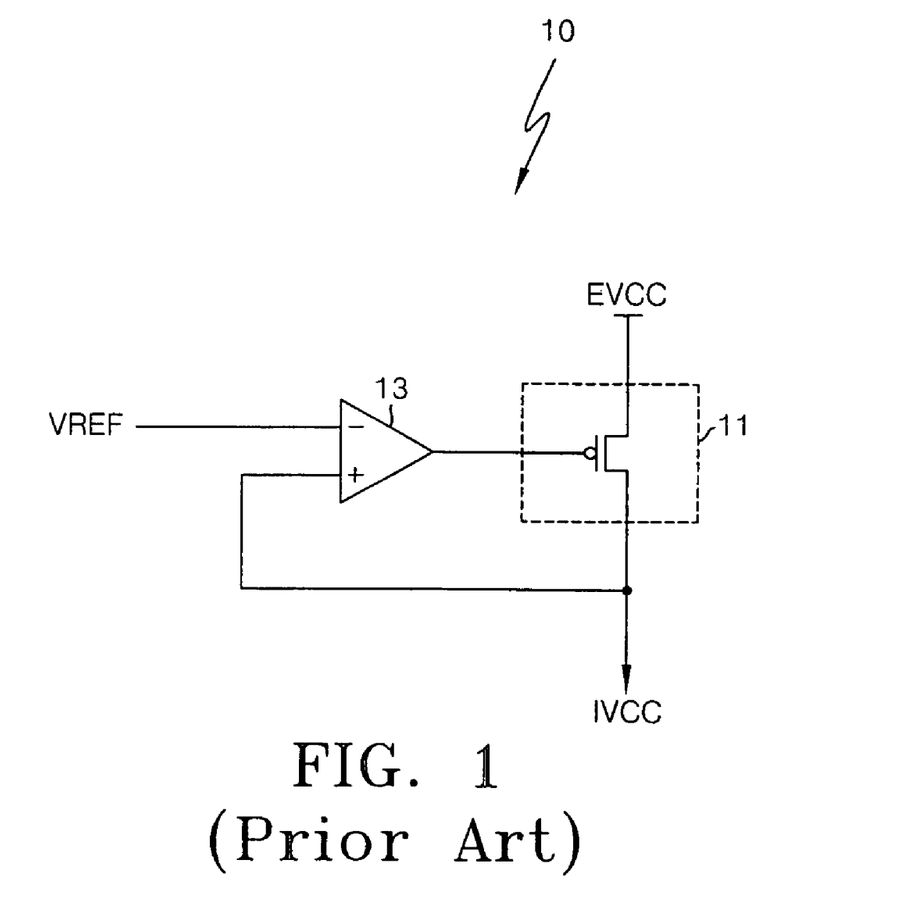
FIG. 1 is a circuit diagram of a conventional internal supply voltage generation circuit.
Figure 2:
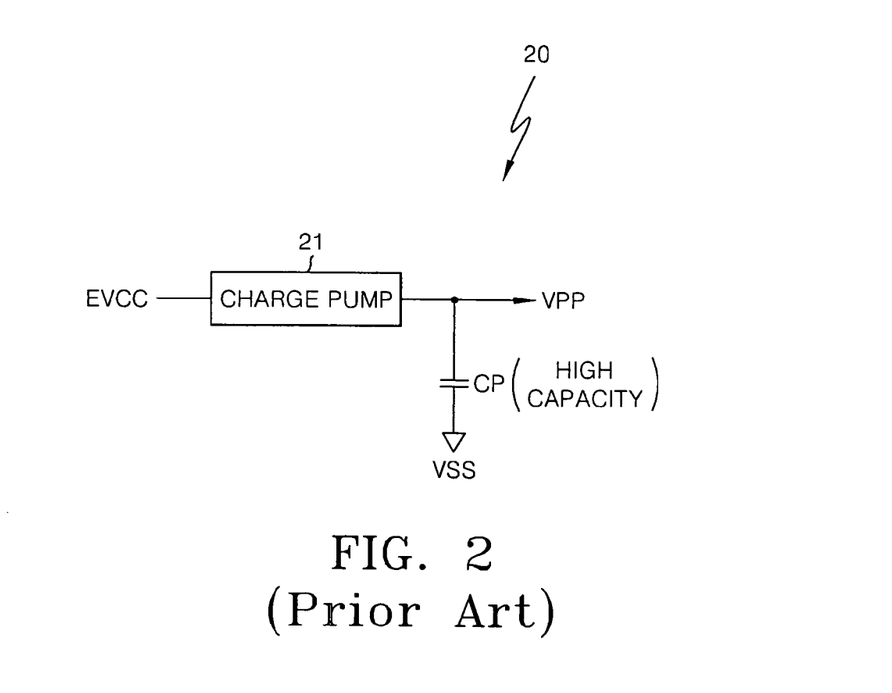
FIG. 2 is a circuit diagram of a conventional boosting voltage generation circuit.

FIG. 1 is a circuit diagram that illustrates a conventional internal supply voltage generation circuit 10, and FIG. 2 is a circuit diagram that illustrates a conventional boosting voltage generation circuit 20. As shown in FIG. 1, the internal supply voltage generation circuit 10 generates an internal supply voltage IVCC from an external supply voltage EVCC using an internal driving unit 11. During an early stage after power up of a semiconductor memory device that includes the internal supply voltage generation circuit 10, the level of internal supply voltage IVCC can increase at a relatively high rate. The internal supply voltage IVCC can be supplied to, for example, source terminals of PMOS transistors within the semiconductor memory device. In FIG. 1, a comparison unit 13 compares the internal supply voltage IVCC and a reference voltage, and attempts to maintain the internal supply voltage IVCC at a constant level responsive to the comparison.

As shown in FIG. 2, the boosting voltage generation circuit 20 pumps charges through a charge pump 21. The pumped charges are stored in a capacitor Cp, such as a high capacitance (capacity) capacitor, so that the level of a boosted voltage VPP increases. During an early stage after power up of a semiconductor memory device that includes the boosting voltage generation circuit 20, the level of the boosted voltage VPP can increase at a relatively low rate. The boosted voltage VPP can be applied to an N-well and, for example, may be applied to an N-well that includes a PMOS transistor with a source terminal connected to the internal supply voltage IVCC.

Figure 3:
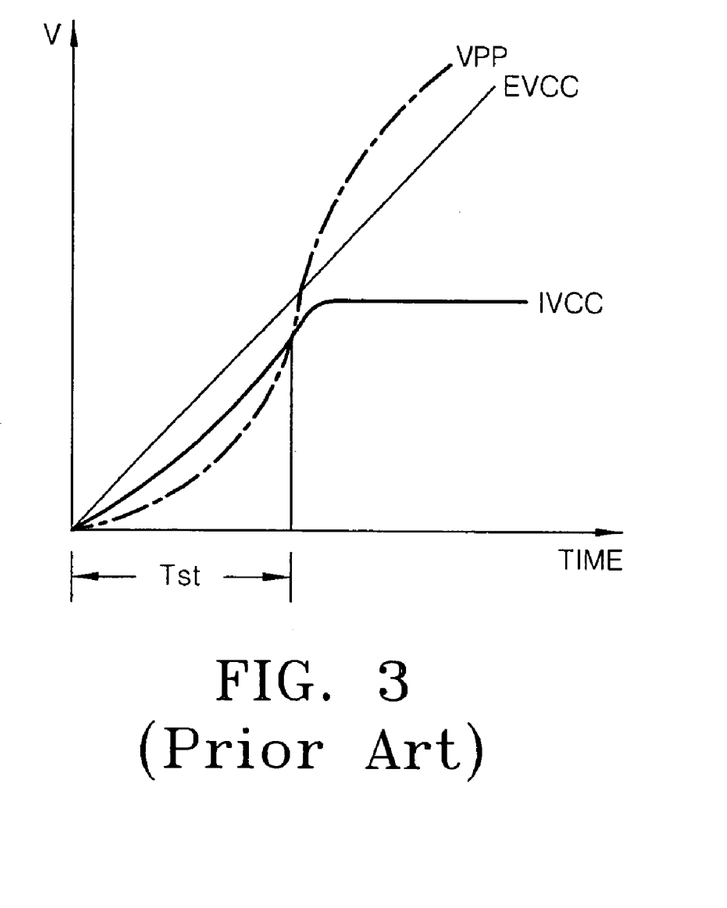
FIG. 3 is a graph that illustrates a comparison of an internal supply voltage with a boosted voltage from the circuit of FIG. 1 relative to a power up time of an associated semiconductor memory device.

In the conventional internal supply voltage generation circuit 10 of FIG. 1, the internal supply voltage IVCC may obtain a voltage level that is higher than a level of the boosted voltage VPP during an early stage of power up (illustrated by the interval Tst shown in FIG. 3). Consequently, a forward bias can be formed between the source region of a PMOS transistor doped with P-type impurities and an N-well doped with N-type impurities. Such forward bias of the transistor shortly after power up may cause the semiconductor memory device in which it resides to malfunction, such as due to a latch-up of associated circuitry.

SUMMARY OF THE INVENTION

Some embodiments of the present invention provide an internal supply voltage generation circuit that is within a semiconductor memory device, and configured to generate an internal supply voltage to a memory array in the semiconductor memory device. The internal supply voltage generation circuit includes an internal driving unit, an internal transmission unit, and an internal sensing unit. The internal driving unit is configured to generate a driving current and a preliminary voltage responsive to an external supply voltage that is supplied from external to the semiconductor memory device, and it varies a magnitude of the driving current responsive to a driving control signal. The internal transmission unit is configured to generate the internal supply voltage responsive to the preliminary voltage from the internal driving unit, and to vary a level of the internal supply voltage to be at least a defined voltage difference less than a boosted voltage. The boosted voltage is greater than the external supply voltage. The internal sensing unit is configured to generate the driving control signal responsive to the internal supply voltage so that the internal supply voltage is maintained at a constant level.

In some further embodiments, the internal transmission unit can include an NMOS transistor that is connected to the internal driving unit and configured to vary a level of the internal supply voltage responsive to the boosted voltage. The internal sensing unit can include a comparator that is configured to compare the internal supply voltage and a predetermined reference voltage, and to generate the driving control signal responsive to the comparison.

In some other embodiments of the present invention, the internal supply voltage generation circuit includes an internal driving unit, an internal transmission unit, and an internal sensing unit. The internal driving unit is configured to generate a driving current and a preliminary voltage responsive to an external supply voltage that is supplied from external to the semiconductor memory device, and it varies a magnitude of the driving current responsive to a driving control signal. The internal transmission unit is configured to generate the internal supply voltage responsive to the preliminary voltage from the internal driving unit, and to vary a level of the internal supply voltage to be at least a defined voltage difference less than a boosted voltage. The boosted voltage is greater than the external supply voltage. The internal sensing unit is configured to generate the driving control signal responsive to the preliminary voltage so that the internal supply voltage is maintained at a constant level.

In some further embodiments, the internal transmission unit can include an NMOS transistor that is connected to the internal driving unit and configured to vary a level of the internal supply voltage responsive to the boosted voltage. The internal sensing unit can include a comparator that is configured to compare the internal supply voltage and a predetermined reference voltage, and to generate the driving control signal responsive to the comparison.

Some other embodiments of the present invention provide a semiconductor memory device with a memory array of a plurality of memory cells that are powered by an internal supply voltage. The semiconductor memory device includes at least one PMOS transistor, a boosting voltage generation circuit, and an internal supply voltage generation circuit. The PMOS transistor includes a N-well of a bit line sense amplifier area configured to drive at least one bit line of the memory array, where a source terminal of the PMOS transistor is connected to the internal supply voltage. The boosting voltage generation circuit is configured to generate a boosted voltage that is greater than an external supply voltage supplied from external to the semiconductor memory device. The boosted voltage is supplied to the N-well of the bit line sense amplifier area. The internal supply voltage generation circuit is configured to generate the internal supply voltage responsive to the external supply voltage, and to vary a level of the internal supply voltage to be at least a defined voltage difference less than a voltage level of the N-well of the bit line sense amplifier area.

In some further embodiments, the internal supply voltage generation circuit includes an internal driving unit, an internal transmission unit, and an internal sensing unit. The internal driving unit is configured to generate a driving current and a preliminary voltage responsive to the external supply voltage and to vary a magnitude of the driving current responsive to a driving control signal. The internal transmission unit is configured to generate the internal supply voltage responsive to the preliminary voltage from the internal driving unit, and to vary a level of the internal supply voltage to be at least a defined voltage difference less than the boosted voltage. The boosted voltage is greater than the external supply voltage. The internal sensing unit is configured to generate the driving control signal responsive to the preliminary voltage so that the internal supply voltage is maintained at a constant level. In some other embodiments, the internal sensing unit is configured to generate the driving control signal responsive to the internal supply voltage so that the internal supply voltage is maintained at a constant level. The internal transmission unit can include an NMOS transistor that is connected to the internal driving unit and configured to vary a level of the internal supply voltage responsive to the boosted voltage.

Some other embodiments of the present invention provide a semiconductor memory device with a memory array of a plurality of memory cells that are powered by an internal supply voltage. The semiconductor memory device includes at least one PMOS transistor, a boosting voltage generation circuit, an internal supply voltage generation circuit, and a boosting transmission circuit. The PMOS transistor includes a N-well of a bit line sense amplifier area configured to drive at least one bit line of the memory array, where a source terminal of the PMOS transistor is connected to the internal supply voltage. The boosting voltage generation circuit is configured to generate a boosted voltage that is greater than an external supply voltage supplied from external to the semiconductor memory device. The boosted voltage is supplied to the N-well of the bit line sense amplifier area. The internal supply voltage generation circuit is configured to generate the internal supply voltage responsive to the external supply voltage, and to vary a level of the internal supply voltage to be at least a defined voltage difference less than a voltage level of a transmission control node. The boosting transmission circuit is configured to supply the boosted voltage from the boosting voltage generation circuit to the transmission control node of the internal supply voltage generation circuit.

In some further embodiments, the internal supply voltage generation circuit can include an internal driving unit, an internal transmission unit, and an internal sensing unit. The internal driving unit is configured to generate a driving current and a preliminary voltage responsive to the external supply voltage and to vary a magnitude of the driving current responsive to a driving control signal. The internal transmission unit is configured to generate the internal supply voltage responsive to the preliminary voltage from the internal driving unit, and to vary a level of the internal supply voltage to be at least a defined voltage difference less than the voltage level of the transmission control node. The internal sensing unit is configured to generate the driving control signal responsive to the preliminary voltage so that the internal supply voltage is maintained at a constant level. The internal transmission unit can include an NMOS transistor that is connected to the internal driving unit and configured to vary a level of the internal supply voltage responsive to the voltage level of the transmission control node.

In some further embodiments, that internal sensing unit can be configured to generate the driving control signal responsive to the internal supply voltage so that the internal supply voltage is maintained at a constant level.

The boosting transmission circuit can include a boosting transmission transistor that is configured to selectively conduct the boosted voltage from the boosting voltage generation circuit to the transmission control node of the internal supply voltage generation circuit for a defined time duration after power up of the semiconductor memory device.

DETAILED DESCRIPTION OF EMBODIMENTS OF THE INVENTION

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Before the construction of the present invention is described in detail, the case in which an internal supply voltage generation circuit and semiconductor memory device having the same according to the present invention exhibit a remarkable effect is described. However, this case is described to facilitate the understanding of the present invention, and the present invention is not limited to the case.

Figure 4:
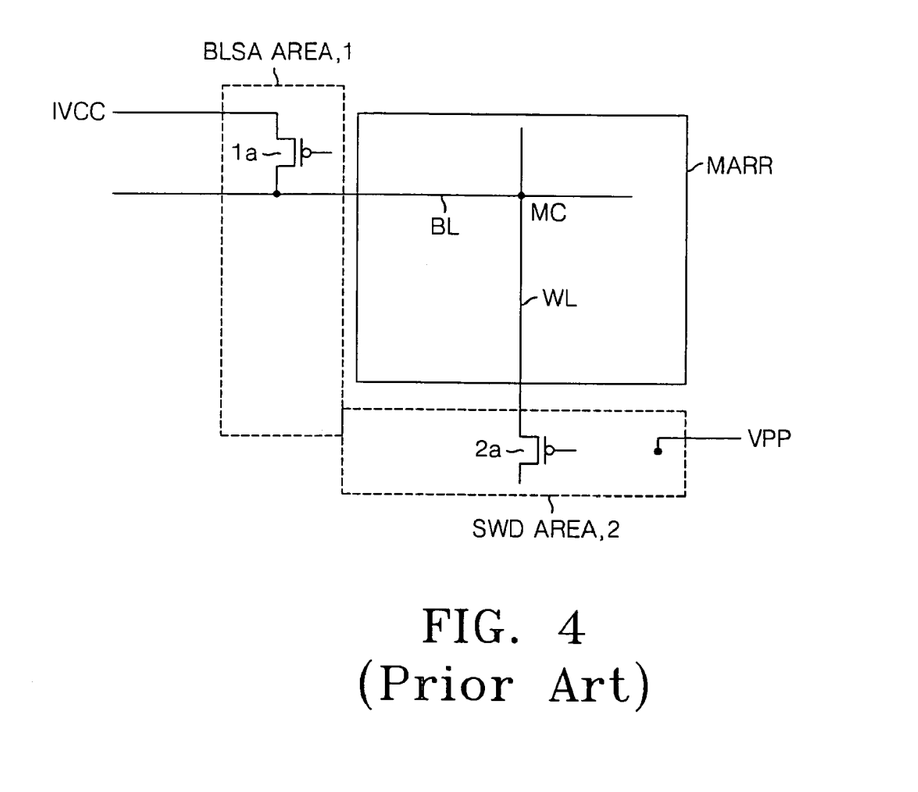
FIG. 4 is a circuit diagram of an area of a bit line sense amplifier and an area of a sub word line driver in a conventional semiconductor memory device.

FIG. 4 is a circuit diagram of a bit line sense amplifier area (hereinafter referred to as a "BLSA area") and a sub word line driver area (hereinafter referred to as a "SWD area") in a conventional semiconductor memory device. Bit line sense amplifiers (not shown) can be included in the BLSA area to control bit lines BL of a memory array MARR. The bit line sense amplifier can include a PMOS transistor 1a, and an internal supply voltage IVCC can be applied to a source terminal of the PMOS transistor 1a. The PMOS transistor 1a can be formed in an N-well 1 of the BLSA area.

The SWD area can include sub word line drivers (not shown) to control word lines WL of the memory array MARR. The sub word line drivers can include a PMOS transistor 2a. The PMOS transistor 2a may be formed in an N-well 2 of the SWD area. A boosted voltage VPP can be applied to the N-well 2 of the SWD area.

To facilitate high integration density in the semiconductor memory device, the N-well 1 of the BLSA area can be electrically connected to the N-well 2 of the SWD area and, consequently, the boosted voltage VPP can also be supplied to the N-well 1 of the BLSA area.

When the boosted voltage VPP is supplied to the N-well 1 of the BLSA area and the internal supply voltage IVCC is higher than the boosted voltage VPP, the semiconductor memory device may malfunction due to, for example, an associated latch up that may result from the voltage difference as was described above. As will now be explained below, an internal supply voltage generation circuit that is configured in accordance with various embodiments of the present invention may be less prone to causing latch-up when the boosted voltage VPP is supplied to the N-well 1 of the BLSA area.

Figure 5:
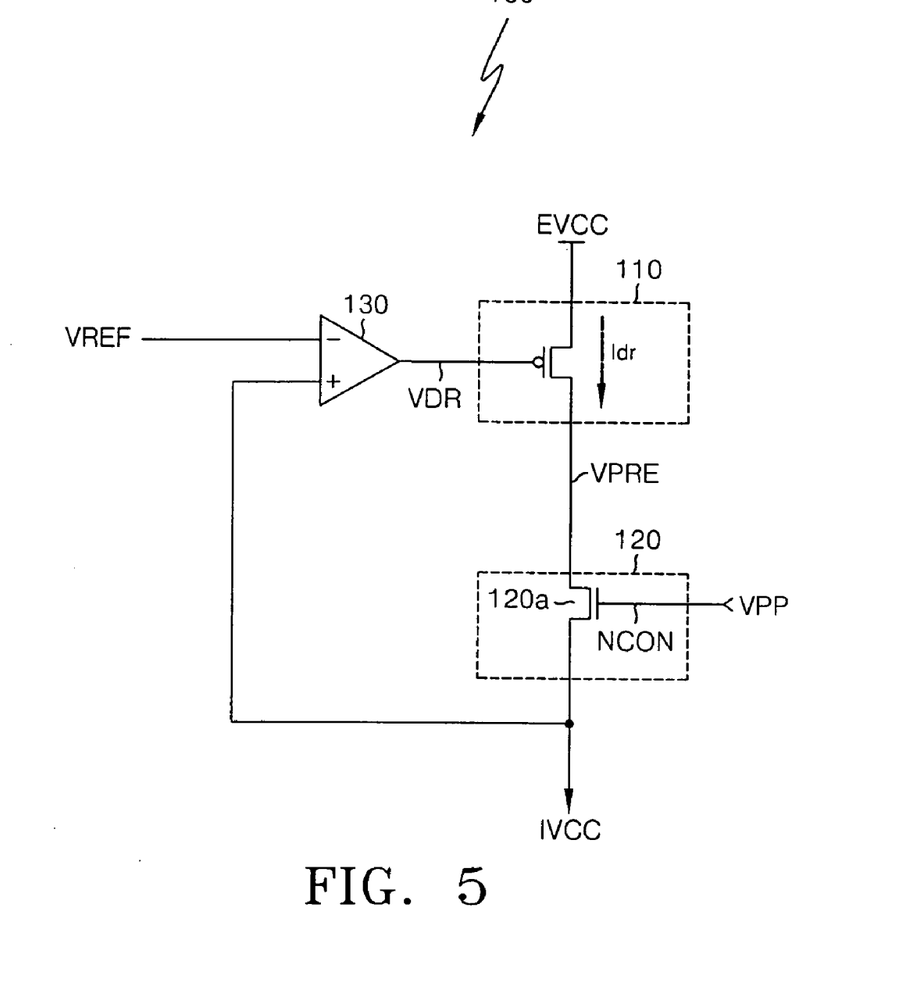
FIG. 5 is a circuit diagram of an internal supply voltage generation circuit according to an embodiment of the present invention.

FIG. 5 is a circuit diagram of an internal supply voltage generation circuit 100 according to an embodiment of the present invention. The internal supply voltage generation circuit 100 generates an internal supply voltage IVCC that is supplied to, for example, a memory array of a semiconductor memory device.

The internal supply voltage generation circuit 100 of FIG. 5 includes an internal driving unit 110, an internal transmission unit 120 and an internal sensing unit 130. The internal driving unit 110 receives a driving current Idr from an external supply voltage EVCC and generates a preliminary voltage VPRE. The magnitude of the driving current Idr is controlled by a driving control signal VDR generated by the internal sensing unit 130. The external supply voltage EVCC is a voltage that is externally supplied to the semiconductor memory device that includes the internal supply voltage generation circuit 100.

The internal transmission unit 120 generates the internal supply voltage IVCC responsive to the preliminary voltage VPRE. The generation of the internal supply voltage IVCC is controlled by the voltage level of a transmission control node NCON. The internal supply voltage IVCC can be adjusted to have a voltage level that is lower than the voltage level of the transmission control node NCON by at least a predetermined voltage difference Vt. For the circuit of FIG. 5, the internal transmission unit 120 can include an NMOS transistor 120a, and the voltage difference Vt can be the threshold voltage of the NMOS transistor 120a.

The voltage applied to the transmission control node NCON can be a boosted voltage VPP that is supplied by a boosting voltage generation circuit within the semiconductor memory device. The boosted voltage VPP can be pumped up (increased) to a voltage level that is higher than the external supply voltage EVCC.

The NMOS transistor 120a, of the internal transmission unit, can be connected between the internal driving unit 110 and the internal supply voltage VCC. The gate terminal of the NMOS transistor 120a can be connected to the transmission control node NCON and the boosted voltage VPP.

The internal sensing unit 130 compares the internal supply voltage IVCC from the internal transmission unit 120 with a reference voltage VREF. The internal sensing unit 130 generates the driving control signal VDR based on the comparison. The driving control signal VDR controls the magnitude of the driving current Idr through the internal driving unit 110 and, thereby, can maintain the internal supply voltage IVCC at a constant level.

Figure 6:
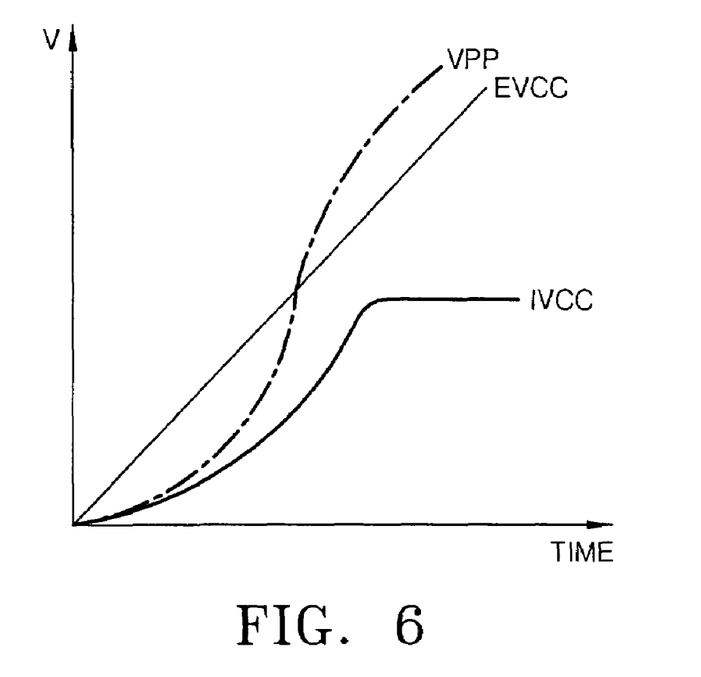
FIG. 6 is graph that illustrates a comparison of an internal supply voltage with a boosted voltage from the circuit of FIG. 5 relative to a power up time of an associated semiconductor memory device in accordance with some embodiments of the present invention.

With continuing reference to the internal supply voltage generation circuit 100 of FIG. 5, the internal supply voltage IVCC can be adjusted to have a voltage level that is lower than the boosted voltage VPP by at least the threshold voltage level of the NMOS transistor 120a. Consequently, during an early stage of power up of the semiconductor memory device, the internal supply voltage IVCC may not become higher than the boosted voltage VPP. FIG. 6 is graph that illustrates a comparison of the internal supply voltage IVCC with the boosted voltage VPP in the circuit of FIG. 5 relative to elapsed time after power up of the associated semiconductor memory device in accordance with some embodiment of the present invention.

Figure 7:
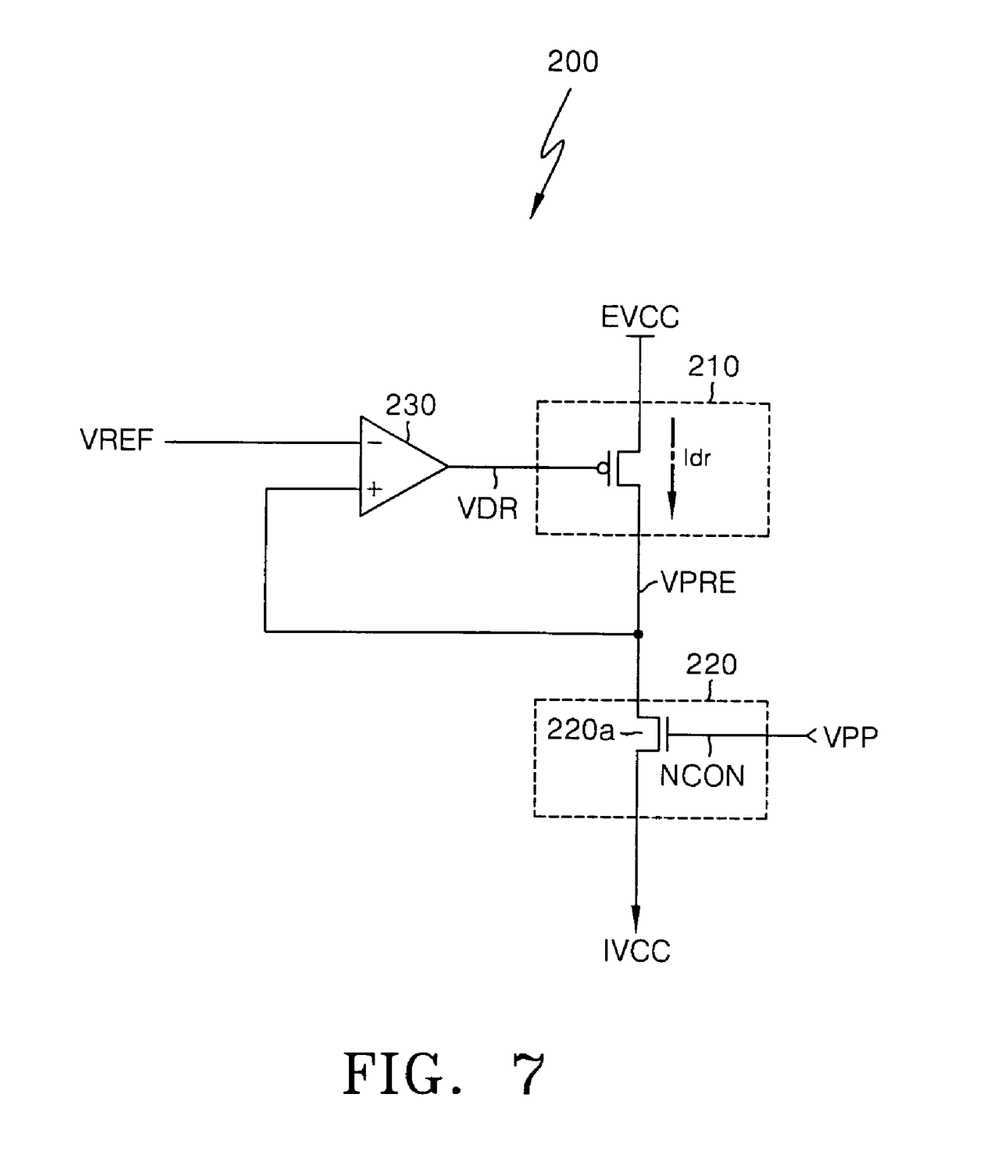
FIG. 7 is a circuit diagram of an internal supply voltage generation circuit according to another embodiment of the present invention.

FIG. 7 is a circuit diagram showing an internal supply voltage generation circuit 200 according to another embodiment of the present invention. The internal supply voltage generation circuit 200 of FIG. 7 is similar to the internal supply voltage generation circuit 100 of FIG. 5, and includes an internal driving unit 210, an internal transmission unit 220 and an internal sensing unit 230. The internal sensing units 230 and 130 of FIGS. 7 and 5 differ in that the internal sensing unit 230 of FIG. 7 compares a preliminary voltage VPRE with a reference voltage VREF. The remainder of the circuits and operation of FIG. 7 as sufficiently similar to that of FIG. 5 so a detailed description thereof is omitted.

Figure 8:
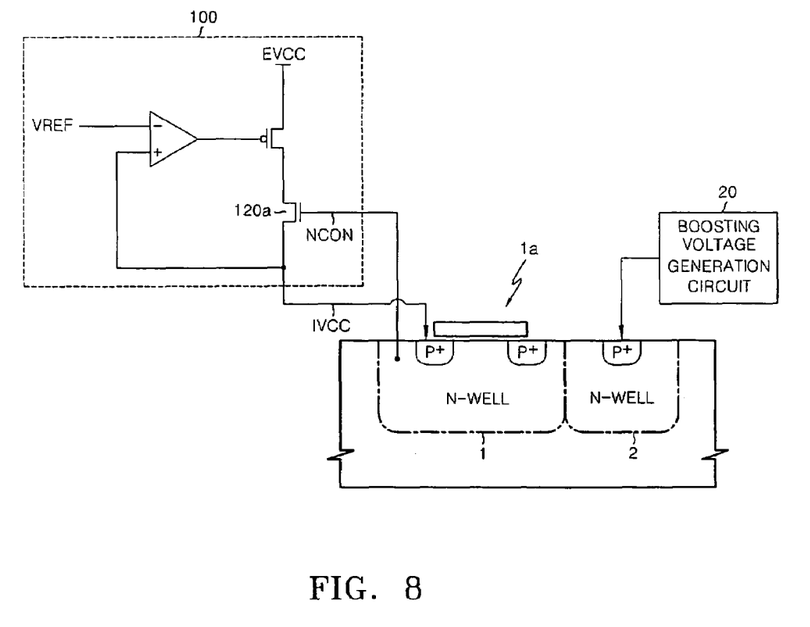
FIG. 8 is a circuit diagram and cross sectional view of a semiconductor memory device according to a first embodiment of the present invention.

FIG. 8 is a circuit diagram and cross sectional view of a semiconductor memory device according to a first embodiment of the present invention. Referring to FIG. 8, a boosting voltage generation circuit 20 is connected to the N-well 2 of the SWD area and the internal voltage generation circuit 100 of FIG. 5 is connected to the N-well 1 of the BLSA area of FIG. 4.

The boosting voltage generation circuit 20 generates the boosted voltage VPP responsive to the external supply voltage EVCC. As described above, the boosted voltage VPP is pumped up (increased) to a voltage level that is higher than the external supply voltage EVCC. The boosted voltage generation circuit 20 may be configured as shown in FIG. 2.

With further reference to FIG. 5, the process by which the internal supply voltage generation circuit 100 drives the external supply voltage EVCC to generate the internal supply voltage IVCC will be described. The transmission control node NCON of the internal supply voltage generation circuit 100 is electrically connected to the N-well 1 of the BLSA area. Consequently, the internal supply voltage IVCC is adjusted to a voltage level that is lower than that of the voltage of the N-well 1 of the BLSA area by at least the threshold voltage of the NMOS transistor 120a. Therefore, in accordance with some embodiments of the present invention, a forward bias may be avoided between the source terminal of a PMOS transistor 1a and the N-well 1, and which may avoid latch-up of associated circuitry.

Figure 9:
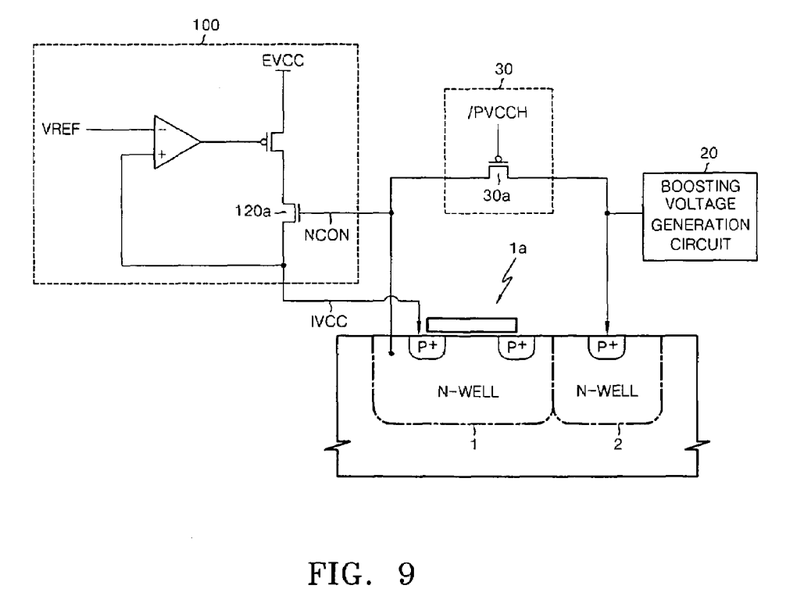
FIG. 9 is a circuit diagram and cross sectional view of a semiconductor memory device according to a second embodiment of the present invention.

FIG. 9 is a circuit diagram and cross sectional view of a semiconductor memory device according to a second embodiment of the present invention. Referring to FIG. 9, the boosting voltage generation circuit 20 is connected to a boosting transmission circuit 30 and the N-well 2 of the SWD area (FIG. 4). The internal voltage generation circuit 100 (e.g., from FIG. 5) is connected to the boosting transmission circuit 30 and the N-well 1 of the BLSA area. The circuit of FIG. 9 is similar to that of FIG. 8, but differs by the addition of the boosting transmission circuit 30.

The boosting transmission circuit 30 selectively conducts the boosting voltage VPP from the boosting voltage generation circuit 20 to the transmission control node NCON of the internal supply voltage generation circuit 100 and the N-well 1 of the BLSA area.

The boosting transmission circuit 30 can include a boosting transmission transistor 30a that may be a PMOS transistor that is controlled by an initial control signal /PVCCH connected to a gate of the transistor 30a. The initial control signal /PVCCH is a signal that is set to a logic L (e.g., low) level during the early stage of power up of the semiconductor memory device and then transitions to a logic H (e.g., high) level after, for example, a defined period of time has elapsed. The transistor 30a can thereby be configured to selectively conduct the boosted voltage from the boosting voltage generation circuit 20 to the transmission control node NCON of the internal supply voltage generation circuit 100 for a defined time duration after power up of the semiconductor memory device.

Accordingly, the circuit shown in FIG. 9 can allow the voltage level of the N-well 1 of the BLSA area to rapidly increase to the boosting voltage VPP, and which may avoid latch-up or other erroneous operation of associated circuitry in the semiconductor memory device.

Because the other circuitry and associated operation shown in FIG. 9 can be configured and operate in a similar way to that described with reference to FIG. 8, a detailed description thereof is omitted.

Figure 10:
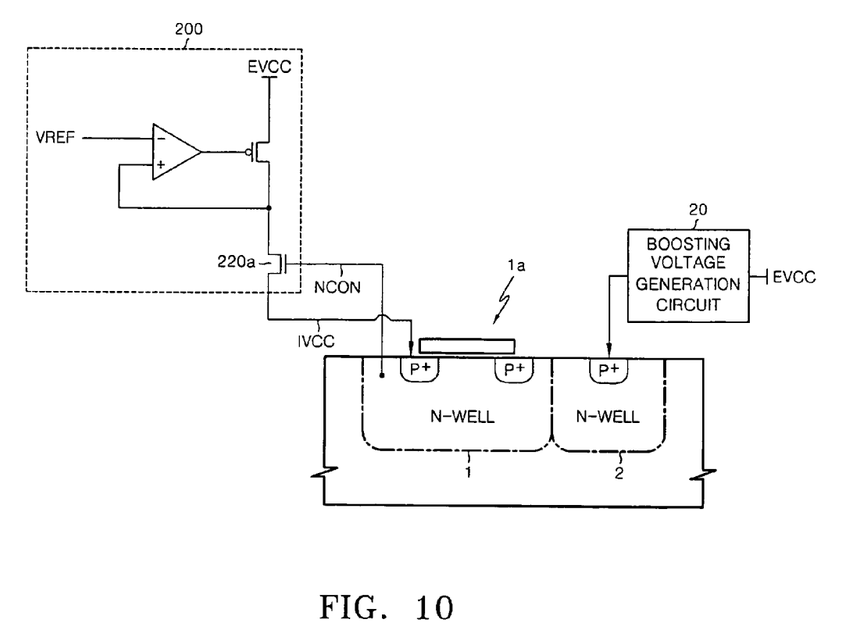
FIG. 10 is a circuit diagram and cross sectional view of a semiconductor memory device according to a third embodiment of the present invention.
Figure 11:
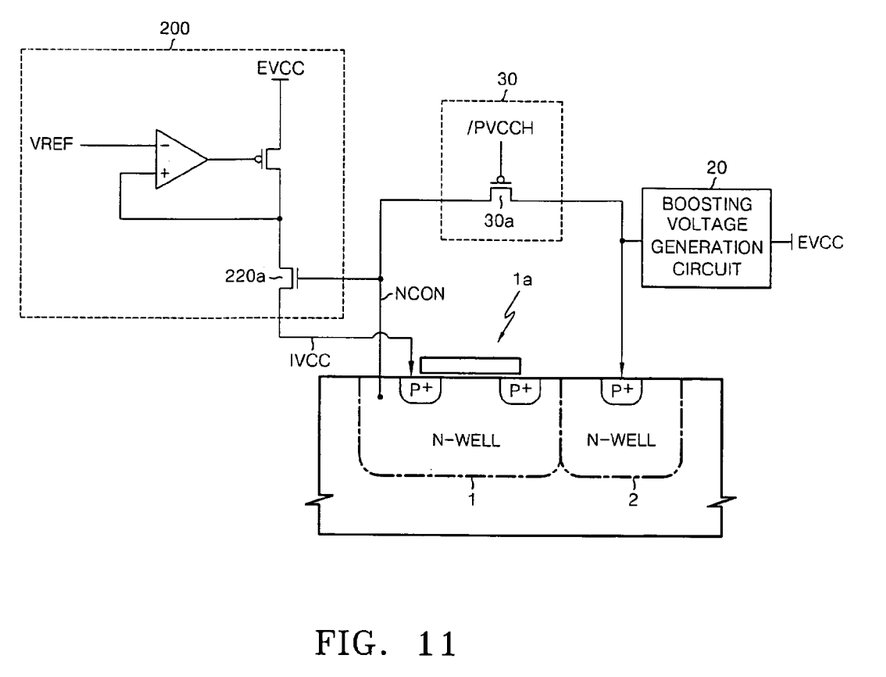
FIG. 11 is a circuit diagram and cross sectional view of a semiconductor memory device according to a fourth embodiment of the present invention.

FIG. 10 is a circuit diagram and cross sectional view of a semiconductor memory device according to a third embodiment of the present invention. FIG. 11 is a circuit diagram and cross sectional view of a semiconductor memory device according to a fourth embodiment of the present invention. The circuitry shown in FIGS. 10 and 11 is similar to that shown in FIGS. 8 and 9, except that the circuitry of FIGS. 10 and 11 includes the internal supply voltage generation circuit 200 shown in FIG. 7 and the circuitry of FIGS. 8 and 9 includes the internal supply voltage generation circuit 100 shown in FIG. 5.

As described above, the circuitry of FIGS. 10 and 11 that include the internal supply voltage generation circuit 200 of FIG. 7 can operate in a similar manner to the circuitry shown in FIGS. 8 and 9 that includes the internal supply voltage generation circuit 100 of FIG. 5. Accordingly, a further description of the circuitry of FIGS. 10 and 11 is omitted.

As described above, in accordance with some embodiments of the present invention, an internal supply voltage generation circuit within a semiconductor memory device can include a transmission control node that controls an internal transmission unit. The internal transmission unit generates an internal supply voltage and can be electrically connected to an N-well of a BLSA area. Consequently, the voltage level of the internal supply voltage can be adjusted lower than the voltage level of the N-well of the BLSA area and, thereby, a forward bias may be avoided between a source terminal of a PMOS transistor and the N-well which may avoid latch-up of associated circuitry.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. An internal supply voltage generation circuit within a semiconductor memory device and configured to generate an internal supply voltage to a memory array in the semiconductor memory device, the internal supply voltage generation circuit comprising:
  an internal driving unit configured to generate a driving current and a preliminary voltage responsive to an external supply voltage supplied from external to the semiconductor memory device, and configured to vary a magnitude of the driving current responsive to a driving control signal;
  an internal transmission unit configured to generate the internal supply voltage responsive to the preliminary voltage from the internal driving unit, and configured to vary a level of the internal supply voltage to be at least a defined voltage difference less than a boosted voltage, wherein the boosted voltage is greater than the external supply voltage; and
  an internal sensing unit configured to generate the driving control signal responsive to the internal supply voltage so that the internal supply voltage is maintained at a constant level.

2. The internal supply voltage generation circuit according to claim 1, wherein the internal transmission unit comprises an NMOS transistor that is connected to the internal driving unit and configured to vary a level of the internal supply voltage responsive to the boosted voltage.

3. The internal supply voltage generation circuit according to claim 1, wherein the internal sensing unit comprises a comparator configured to compare the internal supply voltage and a predetermined reference voltage, and to generate the driving control signal responsive to the comparison.

4. An internal supply voltage generation circuit within a semiconductor memory device and configured to generate an internal supply voltage to a memory array in the semiconductor memory device, the internal supply voltage generation circuit comprising:
  an internal driving unit configured to generate a driving current and a preliminary voltage responsive to an external supply voltage supplied from external to the semiconductor memory device, and configured to vary a magnitude of the driving current responsive to a driving control signal;
  an internal transmission unit configured to generate the internal supply voltage responsive to the preliminary voltage from the internal driving unit, and configured to vary a level of the internal supply voltage to be at least a defined voltage difference less than a boosted voltage, wherein the boosted voltage is greater than the external supply voltage; and
  an internal sensing unit configured to generate the driving control signal responsive to the preliminary voltage so that the internal supply voltage is maintained at a constant level.

5. The internal supply voltage generation circuit according to claim 4, wherein the internal transmission unit comprises an NMOS transistor that is connected to the internal driving unit and configured to vary a level of the internal supply voltage responsive to the boosted voltage.

6. The internal supply voltage generation circuit according to claim 4, wherein the internal sensing unit comprises a comparator configured to compare the preliminary voltage and a predetermined reference voltage, and to generate the driving control signal responsive to the comparison.

7. A semiconductor memory device with a memory array of a plurality of memory cells that are powered by an internal supply voltage, the semiconductor memory device comprising:
  at least one PMOS transistor comprising a N-well of a bit line sense amplifier area configured to drive at least one bit line of the memory array, wherein a source terminal of the PMOS transistor is connected to the internal supply voltage;
  a boosting voltage generation circuit configured to generate a boosted voltage that is greater than an external supply voltage supplied from external to the semiconductor memory device, wherein the boosted voltage is supplied to the N-well of the bit line sense amplifier area; and
  an internal supply voltage generation circuit configured to generate the internal supply voltage responsive to the external supply voltage, and configured to vary a level of the internal supply voltage to be at least a defined voltage difference less than a voltage level of the N-well of the bit line sense amplifier area,
  wherein the internal supply voltage generation circuit comprises:
    an internal driving unit configured to generate a driving current and a preliminary voltage responsive to the external supply voltage and to vary a magnitude of the driving current responsive to a driving control signal;
    an internal transmission unit configured to generate the internal supply voltage responsive to the preliminary voltage from the internal driving unit, and configured to vary a level of the internal supply voltage to be at least a defined voltage difference less than the boosted voltage, wherein the boosted voltage is greater than the external supply voltage; and
    an internal sensing unit configured to generate the driving control signal responsive to the preliminary voltage so that the internal supply voltage is maintained at a constant level.

8. The semiconductor memory device according to claim 7, wherein the internal transmission unit comprises an NMOS transistor that is connected to the internal driving unit and configured to vary a level of the internal supply voltage responsive to the boosted voltage.

9. A semiconductor memory device with a memory array of a plurality of memory cells that are powered by an internal supply voltage, the semiconductor memory device comprising:
  at least one PMOS transistor comprising a N-well of a bit line sense amplifier area configured to drive at least one bit line of the memory array, wherein a source terminal of the PMOS transistor is connected to the internal supply voltage;
  a boosting voltage generation circuit configured to generate a boosted voltage that is greater than an external supply voltage supplied from external to the semiconductor memory device, wherein the boosted voltage is supplied to the N-well of the bit line sense amplifier area; and
  an internal supply voltage generation circuit configured to generate the internal supply voltage responsive to the external supply voltage, and configured to vary a level of the internal supply voltage to be at least a defined voltage difference less than a voltage level of the N-well of the bit line sense amplifier area, wherein the internal supply voltage generation circuit comprises:

an internal driving unit configured to generate a driving current and a preliminary voltage responsive to the external supply voltage and to vary a magnitude of the driving current responsive to a driving control signal;

an internal transmission unit configured to generate the internal supply voltage responsive to the preliminary voltage from the internal driving unit, and configured to vary a level of the internal supply voltage to be at least a defined voltage difference less than the boosted voltage, wherein the boosted voltage is greater than the external supply voltage; and an internal sensing unit configured to generate the driving control signal responsive to the internal supply voltage so that the internal supply voltage is maintained at a constant level.

10. The semiconductor memory device according to claim 9, wherein the internal transmission unit comprises an NMOS transistor that is connected to the internal driving unit and configured to vary a level of the internal supply voltage responsive to the boosted voltage.

11. A semiconductor memory device with a memory array of a plurality of memory cells that are powered by an internal supply voltage, the semiconductor memory device comprising:

at least one PMOS transistor comprising a N-well of a bit line sense amplifier area configured to drive at least one bit line of the memory array, wherein a source terminal of the PMOS transistor is connected to the internal supply voltage;

a boosting voltage generation circuit configured to generate a boosted voltage that is greater than an external supply voltage supplied from external to the semiconductor memory device, wherein the boosted voltage is supplied to the N-well of the bit line sense amplifier area;

an internal supply voltage generation circuit configured to generate the internal supply voltage responsive to the external supply voltage, and configured to vary a level of the internal supply voltage to be at least a defined voltage difference less than a voltage level of a transmission control node; and a boosting transmission circuit configured to supply the boosted voltage from the boosting voltage generation circuit to the transmission control node of the internal supply voltage generation circuit.

12. The semiconductor memory device according to claim 11, wherein the internal supply voltage generation circuit comprises:

an internal driving unit configured to generate a driving current and a preliminary voltage responsive to the external supply voltage and to vary a magnitude of the driving current responsive to a driving control signal;

an internal transmission unit configured to generate the internal supply voltage responsive to the preliminary voltage from the internal driving unit, and configured to vary a level of the internal supply voltage to be at least a defined voltage difference less than the voltage level of the transmission control node; and an internal sensing unit configured to generate the driving control signal responsive to the preliminary voltage so that the internal supply voltage is maintained at a constant level.

13. The semiconductor memory device according to claim 12, wherein the internal transmission unit comprises an NMOS transistor that is connected to the internal driving unit and configured to vary a level of the internal supply voltage responsive to the voltage level of the transmission control node.

14. The semiconductor memory device according to claim 11, wherein the internal supply voltage generation circuit comprises:

an internal driving unit configured to generate a driving current and a preliminary voltage responsive to the external supply voltage and to vary a magnitude of the driving current responsive to a driving control signal;

an internal transmission unit configured to generate the internal supply voltage responsive to the preliminary voltage from the internal driving unit, and configured to vary a level of the internal supply voltage to be at least a defined voltage difference less than the voltage level of the transmission control node; and an internal sensing unit configured to generate the driving control signal responsive to the internal supply voltage so that the internal supply voltage is maintained at a constant level.

15. The semiconductor memory device according to claim 14, wherein the internal transmission unit comprises an NMOS transistor that is connected to the internal driving unit and configured to vary a level of the internal supply voltage responsive to the voltage level of the transmission control node.

16. The semiconductor memory device according to claim 11, wherein the boosting transmission circuit comprises a boosting transmission transistor configured to selectively conduct the boosted voltage from the boosting voltage generation circuit to the transmission control node of the internal supply voltage generation circuit for a defined time duration after power up of the semiconductor memory device.

17. A semiconductor memory device with a memory array of a plurality of memory cells that are powered by an internal supply voltage, the semiconductor memory device comprising:

at least one PMOS transistor comprising a N-well of a bit line sense amplifier area configured to drive at least one bit line of the memory array, wherein a source terminal of the PMOS transistor is connected to the internal supply voltage;

a boosting voltage generation circuit configured to generate a boosted voltage that is greater than an external supply voltage supplied from external to the semiconductor memory device, wherein the boosted voltage is supplied to the N-well of the bit line sense amplifier area; and an internal supply voltage generation circuit configured to generate the internal supply voltage responsive to the external supply voltage, and configured to vary a level of the internal supply voltage to be at least a defined voltage difference less than a voltage level of a transmission control node, wherein the transmission control node is electrically connected to the N-well of the bit line sense amplifier area.

18. The semiconductor memory device according to claim 17, wherein the internal supply voltage generation circuit comprises:

an internal driving unit configured to generate a driving current and a preliminary voltage responsive to the external supply voltage and to vary a magnitude of the driving current responsive to a driving control signal;

an internal transmission unit configured to generate the internal supply voltage responsive to the preliminary voltage from the internal driving unit, and configured to vary a level of the internal supply voltage to be at least a defined voltage difference less than the voltage level of the transmission control node; and an internal sensing unit configured to generate the driving control signal responsive to the preliminary voltage so that the internal supply voltage is maintained at a constant level.

19. The semiconductor memory device according to claim 18, wherein the internal transmission unit comprises an NMOS transistor that is connected to the internal driving unit and configured to vary a level of the internal supply voltage responsive to the voltage level of the transmission control node.

20. The semiconductor memory device according to claim 17, wherein the internal supply voltage generation circuit comprises:

an internal driving unit configured to generate a driving current and a preliminary voltage responsive to the external supply voltage and to vary a magnitude of the driving current responsive to a driving control signal;

an internal transmission unit configured to generate the internal supply voltage responsive to the preliminary voltage from the internal driving unit, and configured to vary a level of the internal supply voltage to be at least a defined voltage difference less than the voltage level of the transmission control node; and an internal sensing unit configured to generate the driving control signal responsive to the internal supply voltage so that the internal supply voltage is maintained at a constant level.

21. The semiconductor memory device according to claim 20, wherein the internal transmission unit comprises an NMOS transistor that is connected to the internal driving unit and configured to vary a level of the internal supply voltage responsive to the voltage level of the transmission control node.

* * * * *